United States Patent [19]

Yokoyama

[11] 4,301,421

[45] Nov. 17, 1981

[54] DIRECT-COUPLED AMPLIFIER WITH OUTPUT OFFSET REGULATION

[75] Inventor: Kenji Yokoyama, Hamamatsu, Japan

[73] Assignee: Nippon Gakki Seizo Kabushiki Kaisha, Hamamatsu, Japan

[21] Appl. No.: 96,061

[22] Filed: Nov. 20, 1979

[30] Foreign Application Priority Data

Nov. 28, 1978 [JP] Japan ........................ 53-146804

[51] Int. Cl.³ .............................................. H03F 3/45
[52] U.S. Cl. ................................. 330/253; 330/259; 330/260
[58] Field of Search ............... 330/253, 256, 259, 260

[56] References Cited

U.S. PATENT DOCUMENTS 3,383,614  5/1968  Emmons et al. ................. 330/256
3,445,777  5/1969  Amodel ............................ 330/256

Primary Examiner—James B. Mullins
Attorney, Agent, or Firm—Frishauf, Holtz, Goodman & Woodward

[57] ABSTRACT

In a direct-coupled amplifier circuit having a first-stage differential amplifier, the junction temperatures or voltages across junctions of differential transistors in the differential amplifier are controlled in accordance with the magnitude and polarity of an output offset voltage, thereby reducing the output offset voltage.

11 Claims, 4 Drawing Figures

ONE CHIP DUAL TR'S

F I G. 3
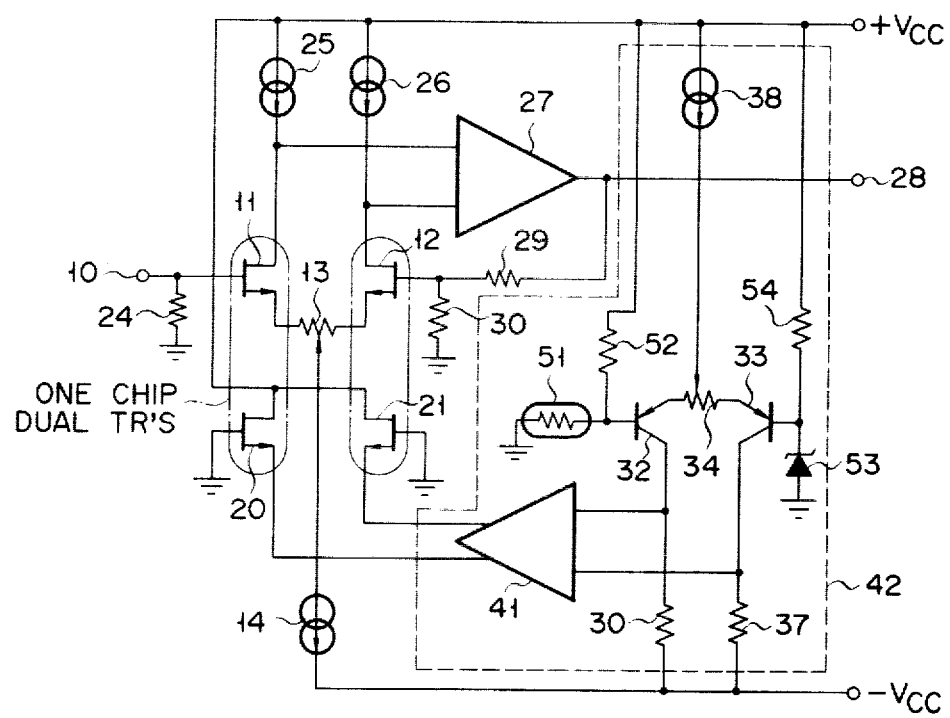

4,301,421

DIRECT-COUPLED AMPLIFIER WITH OUTPUT OFFSET REGULATION

BACKGROUND OF THE INVENTION

This invention relates to an all-stage direct-coupled amplifier, and more specifically to an all-stage direct-coupled amplifier capable of output offset regulation.

Prior art direct-coupled amplifiers employ various measures to reduce output offset voltage. The simplest approach to this problem is to provide a capacitor between a feedback input terminal of a first stage differential amplifier circuit and circuit ground. Such approach will, however, adversely affect the low-frequency response of the amplifier. Maintenance of satisfactory low-frequency response requires the use of a large-capacitance capacitor, which would cause unstable circuit operation.

An output offset regulator circuit utilizing thermal coupling between semiconductor devices, as shown in FIG. 1, has recently been used in an all-stage direct-coupled amplifier. In the all-stage direct-coupled amplifier of FIG. 1, a first stage differential amplifier is comprised of field effect transistors 1 and 2 in order to give a high input impedance characteristic to a power amplifier. The output signal of the first-stage differential amplifier is amplified by a second-stage amplifier 3 including driver and output power stages, and led to an output terminal 4 connected to a load (not shown) such as a loudspeaker. The output terminal 4 is direct-coupled to a feedback input terminal of the first stage differential amplifier, i.e., the gate of the field effect transistor 2. A load of the differential amplifier is a current mirror circuit comprised of bipolar transistors 5 and 6. The transistors 5 and 6 are thermally coupled with transistors 7 and 8 respectively. The bases of transistors 7 and 8 are connected to outputs of a comparator or operational amplifier 9 with one input coupled to the output terminal 4 and the other input coupled to circuit ground, whereby collector currents or junction temperatures of the transistors 7 and 8 are controlled in dependence on the magnitude and polarity of an offset error voltage appearing at the output terminal 4. Thus, the collector currents of transistor 5 and 6 thermal-coupled with the transistors 7 and 8 are controlled to reduce the offset error voltage. This circuit is effective in minimizing the offset voltage since the offset voltage may be regarded as an input-referred offset voltage of the comparator 9.

In the above-mentioned circuit, however, if the collector currents of the transistors 5 and 6 are changed, then the drain currents of FET's 1 and 2 will change to shift their operating points. This will lead to a change in the mutual conductance gm of the FET's and occurrence of distortion.

SUMMARY OF THE INVENTION

An object of this invention is to provide a direct-coupled amplifier capable of output offset regulation with reduced influence on the circuit characteristic.

The above object of this invention is attained by controlling, in accordance with output offset, voltages across junctions of a pair of semiconductor amplifying elements forming a first-stage differential amplifier of a direct-coupled amplifier, which are gate-to-source voltages for field-effect transistors and base-to-emitter voltages for bipolar transistors. According to a preferred embodiment of the invention, the junction temperatures of the semiconductor amplifying elements are controlled according to the output offset to vary the voltages across the junctions of the amplifying elements.

BRIEF DESCRIPTION OF THE DRAWINGS

FIG. 3 is a schematic circuit diagram of a direct-coupled amplifier according to another embodiment of the invention.

DETAILED DESCRIPTION OF THE PREFERRED EMBODIMENTS

This invention results from consideration of a fact that as long as a constant drain bias current flows through FET's, the mutual conductance gm of the FET's hardly changes despite the variation between the transfer characteristics of the FET's, that is, even if the gate-to-source voltage Vgs required for a certain magnitude of drain current to flow through FET varies between FET's. According to the principle of this invention, the gate-to-source voltage Vgs of differential FET's of a first-stage differential amplifier of an all-stage direct-coupled amplifier circuit are varied by changing the junction temperatures of the differential FET's while keeping the drain bias current of the differential FET's constant, thereby correcting an output offset.

Figure 1:
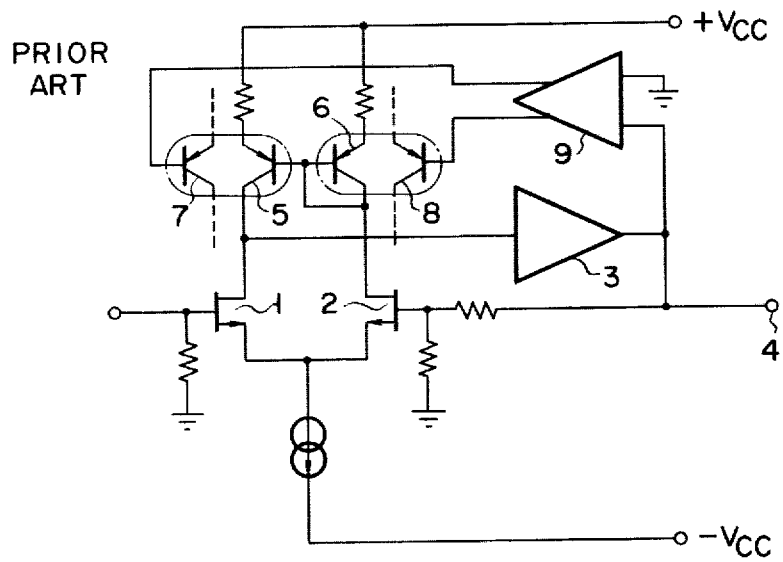
FIG. 1 is a schematic circuit diagram of a prior art direct-coupled amplifier capable of output offset regulation.
Figure 2:
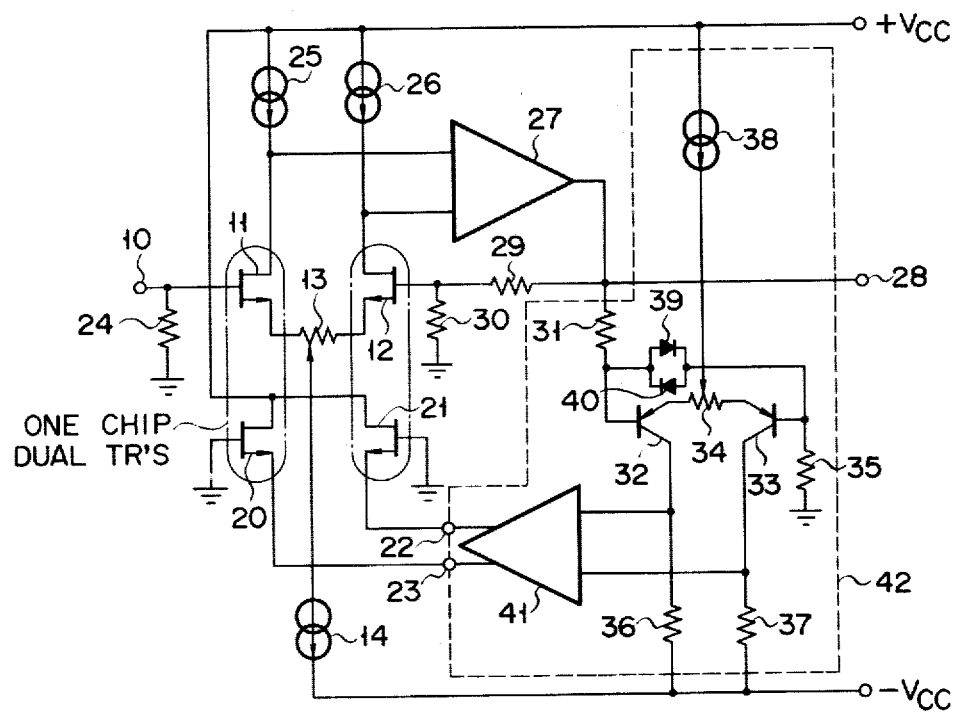
FIG. 2 is a schematic circuit diagram of a direct-coupled amplifier capable of output offset regulation according to an embodiment of this invention.

Referring now to FIG. 2, an input terminal 10 is connected to circuit ground by way of a resistor 24, and also to the gate of an N-channel junction FET 11. The source of FET 11 is connected to the source of an N-channel junction FET 12 by way of a potentiometer 13 having its slider connected to a negative power supply terminal ($-V_{CC}$) through a constant-current source 14. The drains of FET's 11 and 12 are connected to a positive power supply terminal ($+V_{CC}$) via constant-current sources 25 and 26, respectively. The drains of FET's 11 and 12 are also connected to inputs of an amplifier 27, whose output is connected to an output terminal 28. The output terminal 28 is connected through a resistor 29 to the gate of FET 12 which is connected to circuit ground by way of a resistor 30. The output terminal 28 is also connected through a resistor 31 to the base of a transistor 32 whose emitter is connected to the emitter of a transistor 33 through a potentiometer 34. The base of transistor 33 is connected to circuit ground through a resistor 35. The collectors of transistors 32 and 33 are connected to the negative power supply terminal via resistors 36 and 37, respectively. The slider of potentiometer 34 is connected to the positive power supply terminal through a constant-current source 38. Mutually oppositely poled diodes 39 and 40 are connected in parallel between the bases of transistors 32 and 33. The collectors of the differential transistors 32 and 33 are connected to inputs of a comparator 41. A section enclosed with a broken line constitutes an offset detector circuit 42. Outputs 22 and 23 of the comparator 41 are connected respectively to the sources of FET's 20 and 21 which are thermally coupled with the FET's 11 and 12 respectively, output voltages at the outputs 22 and 23 varying in opposite direction. The FET's 20 and 21 have their drains and gates connected to the positive power supply terminal and circuit ground, respectively. The thermal-coupled pairs of transistors 11 and 20; 12 and 21 are preferably one-chip dual transistors, that is, paired transistors fabricated on a common semiconductor substrate.

In the above-mentioned circuit arrangement, the potentiometer 13 is intended for adjusting output offset, which may be caused by variation of the transfer characteristics between the FET's 11 and 12, to zero at zero input signal condition. The potentiometer 34 tends to equalize the junction temperatures of the FET's 20 and 21 at the normal temperature level.

In the signal amplifying operation of the circuit of FIG. 2, an input signal applied to the input terminal 10 is amplified by the differential FET's 11 and 12, further amplified by the amplifier 27, and led to the output terminal 28. The output signal of the amplifier 27 is fed back to the gate of FET 12 via the resistor 29.

Offset regulating operation will now be described. If a potential at the output terminal 28 is adjusted to ground level by the potentiometer 13 at zero signal condition, a voltage V1 between the gate of FET 11 and the slider of potentiometer 13 is equal to a voltage V2 between the gate of FET 12 and the slider of potentiometer 13. When an offset voltage is produced at the output terminal 28 by temperature change, V2 is differentiated from V1. The offset voltage is detected and amplified by the differential transistors 32 and 33 as the difference between the base potential of transistor 32 and the base potential (ground potential) of transistor 33. The amplified offset voltage is applied to the comparator 41 as the difference between the collector potentials of the differential transistors 32 and 33. The comparator 41 controls, in response to the magnitude and polarity of the output voltage of the differential transistors 32 and 33, the source potentials of FET's 20 and 21 which are thermal-coupled with the differential FET's 11 and 12 respectively. As a result, the junction temperatures of FET's 20 and 21 are controlled to have a difference in temperature therebetween corresponding to the magnitude and polarity of the output offset voltage thereby changing the gate-to-source voltages Vgs of FET's 11 and 12 in opposite directions. In the offset control system of this invention, the voltages Vgs of FET's 11 and 12 are so controlled as to make V2 equal to V1. If the offset voltage is positive, for example, Vgs of the FET 12 is lowered, while Vgs of the FET 11 is raised. If the offset voltage is negative, Vgs of the FET's 11 and 12 are varied in the opposite direction to that when the offset voltage is positive. The voltage Vgs of FET has a positive or negative temperature coefficient dependent on its operating region. Therefore, the connections between the sources of FET's 20 and 21 and the outputs 22 and 23 of the comparator 41 are determined in accordance with the sign of the temperature coefficient of the differential FET's 11 and 12.

FIG. 3 is a circuit diagram showing another embodiment of this invention. This embodiment is based on the recognition that the output offset voltage substantially depends on the junction temperature of the input differential transistors or the ambient temperature so that the output offset may be cancelled by detecting such temperature which is fed back as a control parameter to the differential transistors. The same parts or portions as those in FIG. 2 are denoted by like reference numerals, and description of such parts will not be repeated. Unlike the circuit of FIG. 2 which directly detects the output offset at the output terminal 28, the circuit of FIG. 3 detects the output offset on the basis of a temperature-dependent resistance change of a temperature sensing element 51. Thus, the transistor 32 has its base connected to circuit ground by way of the temperature sensing element 51 such as a thermistor, and also to the positive power supply terminal through a resistor 52. On the other hand, the transistor 33 has its base connected to circuit ground and the positive power supply terminal by way of a zener diode 53 and a resistor 54, respectively.

In the circuit of FIG. 3, the resistance value of the temperature sensing element 51 is varied as the ambient temperature changes, that is, as the output offset is caused. This changes the base potential of the transistor 32. In consequence, the differential transistors 32 and 33 produce an output voltage with magnitude and polarity in accordance with those of the output offset voltage. Thereafter, the output offset is corrected in the same manner as in the circuit of FIG. 2.

Figure 4:
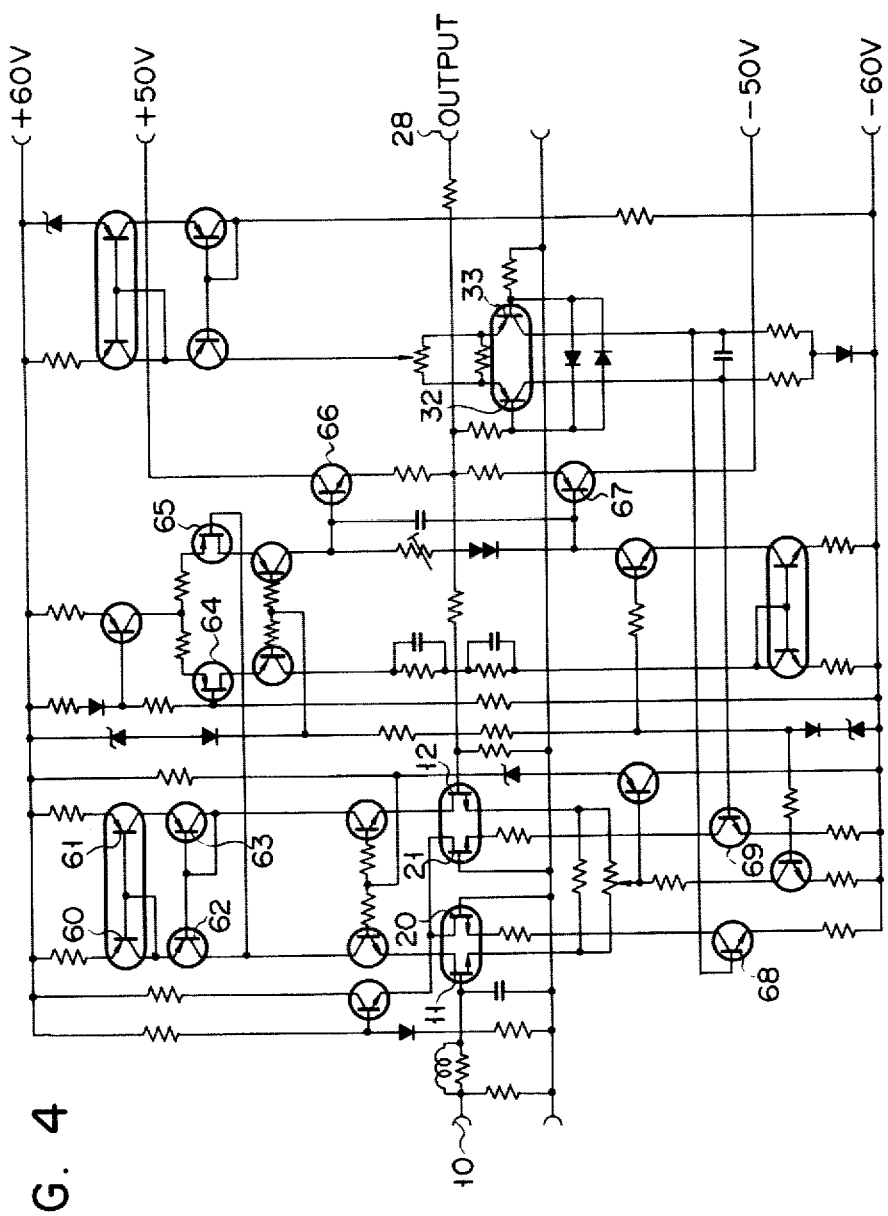
FIG. 4 is a practical circuit diagram corresponding to the embodiment of FIG. 2.

FIG. 4 is a practical circuit diagram corresponding to the embodiment of FIG. 2, in which like reference numerals refer to the same parts as shown in FIG. 2. In this circuit, loads of the differential transistors 11 and 12 are formed of a pair of current-mirror circuits including transistors 60 to 63. The output signals of the differential transistors 11 and 12 are amplified by a driver circuit comprised of FET's 64 and 65 connected in differential configuration. The output signal of the driver circuit is amplified and led to the output terminal 28 by an output circuit comprised of complementary transistors 66 and 67 connected in single-ended push-pull operation configuration. A comparator supplied with the output signals of the differential transistors 32 and 33 to detect the output offset is comprised of transistors 68 and 69.

Although this invention may be applied to an all-stage direct-coupled amplifier circuit whose first-stage differential amplifier is formed of bipolar transistors, it is particularly suitable for a direct-coupled amplifier circuit whose first-stage differential amplifier is formed of FET's which have a gain lower than bipolar transistors.

What is claimed is:

1. A direct-coupled amplifier having an input terminal to receive an input signal and an output terminal to be coupled to a load, comprising:
a source of power supply having at least two terminals;
a differential amplifier circuit including first and second amplifying elements connected in differential configuration between power supply terminals, said first and second amplifying elements each having a control electrode and first and second electrodes with a conduction path formed therebetween, said control electrode of said first amplifying element being coupled to said input terminal, said control electrode of said second amplifying element being coupled to said output terminal through a negative feedback network, said first electrodes of said first and second amplifying elements being respectively coupled to one of said power supply terminals via constant current circuits for maintaining respective currents of said first and second amplifying elements constant, said second electrodes of said first and second amplifying elements being coupled together;

an offset detector circuit to detect an output offset of said output terminal; and an offset regulator circuit coupled to said offset detector circuit for continuously regulating, in response to said offset detector circuit, voltages between the respective control electrodes and second electrodes of said first and second amplifying elements of said differential amplifier circuit.

2. A direct-coupled amplifier according to claim 1, wherein said offset regulator circuit includes first and second heating elements thermal-coupled respectively with said first and second amplifying elements of said differential amplifier circuit.

3. A direct-coupled amplifier according to claim 2, wherein said first and second amplifying elements and said first and second heating elements are all field effect transistors.

4. A direct-coupled amplifier according to claim 1, wherein said offset detector circuit includes a circuit for detecting the difference between an output offset voltage and a reference voltage.

5. A direct-coupled amplifier according to claim 1, wherein said offset detector circuit includes a circuit for detecting the output offset at said output terminal by a change in ambient temperature.

6. A direct-coupled amplifier circuit having an input terminal to receive an input signal to be amplified and an output terminal to be coupled to a load, comprising:

a source of power supply having at least two terminals;

a differential amplifier stage having first and second field effect transistors connected in a differential configuration between power supply terminals, said first field effect transistor having its gate electrode connected to circuit ground through a resistor and to said input terminal, said second field effect transistor having its gate electrode connected to circuit ground through a resistor and to said output terminal through a negative feedback network, said first and second field effect transistors having their drain electrodes respectively connected to one of said power supply terminals via constant current circuits for maintaining respective currents of said first and second field effect transistors constant, said first and second field effect transistors having their source electrodes coupled together;

an offset detection circuit connected to said output terminal for detecting the magnitude and polarity of an offset voltage at said output terminal relative to ground potential, said offset detection circuit having first and second output terminals the output voltages on which continuously vary in opposite directions in accordance with the output offset voltage; and an offset regulating circuit including third and fourth field effect transistors having their drain electrodes commonly connected to a power supply terminal and their source electrodes connected to said first and second output terminals of said offset detection circuit, respectively, said third and fourth field effect transistors being thermally coupled with said first and second field effect transistors, respectively.

7. A direct-coupled amplifier circuit having an input terminal to receive an input signal to be amplified and an output terminal to be coupled to a load, comprising:

a source of power supply having at least two terminals;

a differential amplifier stage having first and second field effect transistors connected in a differential configuration between power supply terminals, said first field effect transistor having its gate electrode connected to circuit ground through a resistor and to said input terminal, said second field effect transistor having its gate electrode connected to circuit ground through a resistor and to said output terminal through a negative feedback network, said first and second field effect transistors having their drain electrodes respectively connected to one of said power supply terminals via constant current circuits for maintaining respective currents of said first and second field effect transistors constant, said first and second field effect transistors having their source electrodes coupled together;

an offset detection circuit responsive to a change in ambient temperature to detect the magnitude and polarity of an output offset at said output terminal relative to ground potential, said offset detection circuit having first and second output terminals the output voltages on which continuously vary in opposite directions with ambient temperature; and an offset regulating circuit including third and fourth field effect transistors having their drain electrodes commonly connected to a power supply terminal and their source electrodes connected to said first and second output terminals of said offset detection circuit, respectively, said third and fourth field effect transistors being thermally coupled with said first and second field effect transistors, respectively.

8. A direct-coupled amplifier according to claim 6 or 7, wherein said first and third field effect transistors are one-chip dual transistors and said second and fourth field effect transistors are one-chip dual transistors.

9. A direct-coupled amplifier circuit according to claim 6, wherein said offset detection circuit includes first and second differential bipolar transistors, said first bipolar transistor having its base electrode connected to said output terminal and said second bipolar transistor having its base electrode connected to circuit ground.

10. A direct-coupled amplifier circuit according to claim 7, wherein said offset detection circuit includes first and second differential bipolar transistors, said first bipolar transistor having its base electrode connected to a temperature-dependent voltage source and said second bipolar transistor having its base electrode connected to a reference voltage source.

11. A direct-coupled amplifier having an input terminal to receive an input signal and an output terminal to be coupled to a load, comprising:

a source of power supply having at least two terminals;

a differential amplifier circuit including first and second amplifying elements connected in differential configuration between power supply terminals, said first and second amplifying elements each having a control electrode and first and second electrodes with a conduction path formed therebetween, said control electrodes of said first and second amplifying elements being coupled to said input and output terminals respectively, said first electrodes of said first and second amplifying elements being respectively coupled to one of said power supply terminals via constant current circuits for maintaining respective currents of said first and second amplifying elements constant, said second electrodes of said first and second amplifying elements being coupled together;

an offset detector circuit to detect an output offset of said output terminal; and an offset regulator circuit including first and second heating elements thermal-coupled respectively with said first and second amplifying elements, said first and second heating elements being heated to have a difference in temperature therebetween in accordance with an output of said offset detector circuit to thereby continuously regulate voltages between the respective control electrodes and second electrodes of said first and second amplifying elements.

* * * * *